(12) United States Patent
Ash et al.

(10) Patent No.: US 9,354,470 B2
(45) Date of Patent: May 31, 2016

(54) ELECTRO-OPTIC DEVICE

(71) Applicant: Gentex Corporation, Zeeland, MI (US)

(72) Inventors: Kevin L. Ash, Grand Rapids, MI (US); Sue F. Franz, Holland, MI (US); Adam R. Heintzelman, Grand Rapids, MI (US); David J. Cammenga, Zeeland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 14/494,789

(22) Filed: Sep. 24, 2014

(65) Prior Publication Data

US 2015/0085341 A1 Mar. 26, 2015

Related U.S. Application Data

(60) Provisional application No. 61/881,941, filed on Sep. 24, 2013.

(51) Int. Cl.
*G02F 1/153* (2006.01)
*G02F 1/15* (2006.01)
(Continued)

(52) U.S. Cl.
CPC .......... *G02F 1/133602* (2013.01); *G02F 1/153* (2013.01); *G02F 1/157* (2013.01);
(Continued)

(58) Field of Classification Search
CPC ......... G02F 1/167; G02F 1/1393; G02F 1/29; G02F 1/0322; G02F 1/03; G03G 13/22; G03G 17/04; G09G 3/16; B82Y 20/00
USPC ......... 359/296, 245, 315, 247, 251–252, 254, 359/108, 237–238, 278–279, 290–292, 298, 359/300–302, 259, 265–275; 430/31–32; 345/49, 105, 107; 349/33, 38; 438/929
See application file for complete search history.

(56) References Cited

U.S. PATENT DOCUMENTS

| 5,928,572 A | 7/1999 | Tonar et al. |
| 5,998,617 A | 12/1999 | Srinivasa et al. |

(Continued)

FOREIGN PATENT DOCUMENTS

| DK | WO 2004100506 A1 * | 11/2004 | .......... H04M 1/0283 |
| WO | 9842796 A1 | 10/1998 | |

(Continued)

OTHER PUBLICATIONS

U.S. Appl. No. 61/590,259, filed Jan. 24, 2012, entitled Rearview Assembly with Interchangeable Rearward Viewing Device, 13 pages.
(Continued)

*Primary Examiner* — Dawayne A Pinkney
(74) *Attorney, Agent, or Firm* — Price Heneveld LLP; Scott P. Ryan

(57) ABSTRACT

An emissive display system includes an electro-optic device having a first substantially transparent substrate including first and second surfaces, at least one of which includes a first electrically conductive layer. A second substantially transparent substrate includes third and fourth surfaces, at least one of which includes a second electrically conductive layer. A primary seal is disposed around perimeter portions of the first and second substrates, which define a cavity therebetween. An electro-optic medium is disposed in the cavity and is variably transmissive such that the electro-optic device is operable between substantially clear and darkened states. A plurality of beads are disposed in a central portion of the cavity and are movable to a perimeter portion of the cavity. A substantially transparent light emitting display is disposed adjacent to the electro-optic device, which is in the darkened state when the light emitting display is emitting light.

11 Claims, 5 Drawing Sheets

(51) Int. Cl.

| | | |
|---|---|---|
| G03G 17/04 | (2006.01) | |
| G09G 3/19 | (2006.01) | |
| G02F 1/1335 | (2006.01) | |
| G02F 1/161 | (2006.01) | |
| G02F 1/163 | (2006.01) | |
| G02F 1/157 | (2006.01) | |
| H01L 51/52 | (2006.01) | |
| H01L 27/32 | (2006.01) | |
| G02F 1/155 | (2006.01) | |

(52) U.S. Cl.
CPC .............. *G02F 1/1521* (2013.01); *G02F 1/161* (2013.01); *G02F 1/163* (2013.01); *H01L 27/3232* (2013.01); *H01L 51/525* (2013.01); *H01L 51/5246* (2013.01); *H01L 51/5281* (2013.01); *G02F 1/133603* (2013.01); *G02F 1/155* (2013.01); *G02F 2001/133626* (2013.01); *G02F 2001/1512* (2013.01); *G02F 2001/1515* (2013.01); *G02F 2001/1519* (2013.01); *G02F 2201/44* (2013.01); *H01L 2251/5323* (2013.01)

(56) References Cited

U.S. PATENT DOCUMENTS

| | | | |
|---|---|---|---|
| 6,020,987 | A | 2/2000 | Baumann et al. |
| 6,037,471 | A | 3/2000 | Srinivasa et al. |
| 6,137,620 | A | 10/2000 | Guarr et al. |
| 6,141,137 | A | 10/2000 | Byker et al. |
| 6,193,912 | B1 | 2/2001 | Thieste et al. |
| 6,241,916 | B1 | 6/2001 | Claussen et al. |
| 6,249,369 | B1 | 6/2001 | Theiste et al. |
| 6,396,559 | B1 | 5/2002 | Kishimoto et al. |
| 6,654,070 | B1 | 11/2003 | Rofe |
| 6,700,692 | B2 | 3/2004 | Tonar et al. |
| 7,372,611 | B2 | 5/2008 | Tonar et al. |
| 8,169,684 | B2 | 5/2012 | Bugno et al. |
| 8,201,800 | B2 | 6/2012 | Filipiak |
| 8,210,695 | B2 | 7/2012 | Roth et al. |
| 8,264,761 | B2 | 9/2012 | Cammenga et al. |
| 8,545,030 | B2 | 10/2013 | Anderson et al. |
| 8,598,271 | B2 | 12/2013 | Oda et al. |
| 8,646,924 | B2 | 2/2014 | Roth et al. |
| 8,814,373 | B2 | 8/2014 | Steel et al. |
| 8,827,517 | B2 | 9/2014 | Cammenga et al. |
| 8,885,240 | B2 | 11/2014 | Roth et al. |
| 8,925,891 | B2 | 1/2015 | Van Huis et al. |
| 2002/0015214 | A1 | 2/2002 | Nishikitani et al. |
| 2003/0002006 | A1* | 1/2003 | Freeman ............ G02F 1/13392 349/156 |
| 2006/0252031 | A1 | 11/2006 | Abbott et al. |
| 2007/0138941 | A1 | 6/2007 | Jin et al. |
| 2008/0266642 | A1 | 10/2008 | Burrell et al. |
| 2010/0277786 | A1 | 11/2010 | Anderson et al. |
| 2012/0229882 | A1 | 9/2012 | Fish, Jr. et al. |
| 2012/0327234 | A1 | 12/2012 | Fish, Jr. et al. |
| 2013/0170013 | A1 | 7/2013 | Tonar et al. |
| 2013/0234935 | A1 | 9/2013 | Griffith |
| 2013/0313565 | A1* | 11/2013 | Kikkawa ............ H01L 29/2003 257/76 |
| 2014/0063630 | A1 | 3/2014 | Busscher et al. |

FOREIGN PATENT DOCUMENTS

| | | |
|---|---|---|
| WO | 9902621 A1 | 1/1999 |
| WO | 2007133396 A2 | 11/2007 |

OTHER PUBLICATIONS

U.S. Appl. No. 61/704,869, filed Sep. 24, 2012, entitled Image Manipulation for Automotive Rearview Device, 7 pages.
U.S. Appl. No. 61/707,625, filed Sep. 28, 2012, entitled Integrated Spotter in Interior Electrochromic Mirror, 69 pages.
U.S. Appl. No. 61/707,676, filed Sep. 28, 2012, entitled Double Ball Slide on Mount With Screw Over Sensor, 19 pages.
U.S. Appl. No. 61/709,716, filed Oct. 4, 2012, entitled Rearview Mounting Device, 11 pages.
International Searching Authority, International Search Report and Written Opinion for International Application No. PCT/US 2014/057264, Feb. 19, 2015, 13 pages.

\* cited by examiner

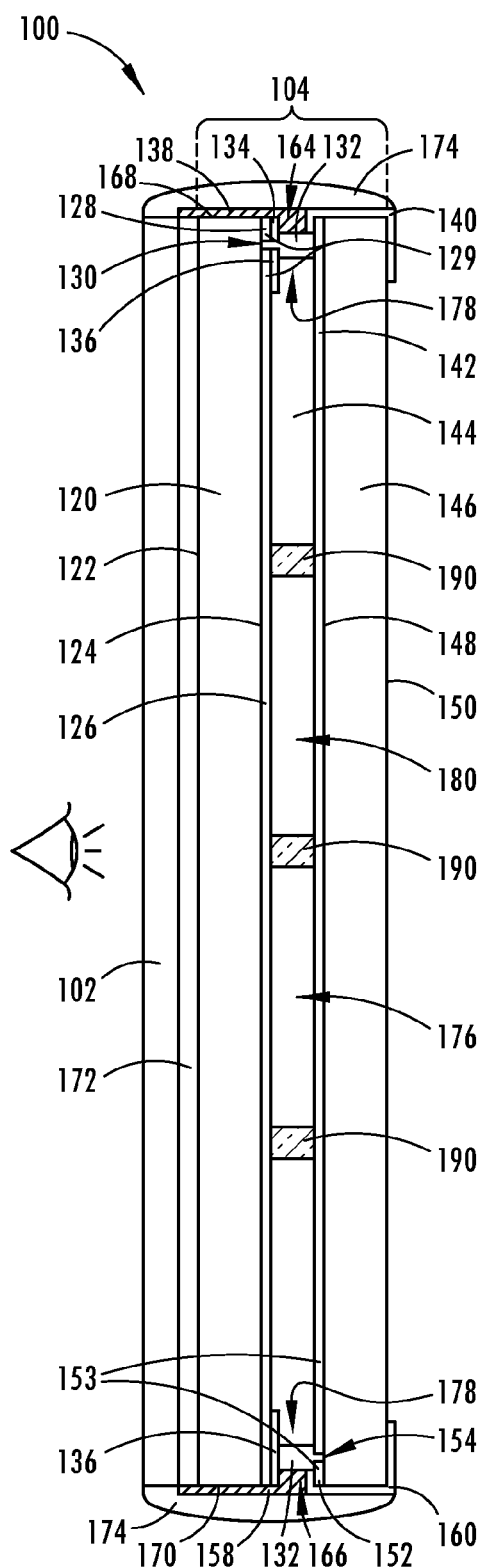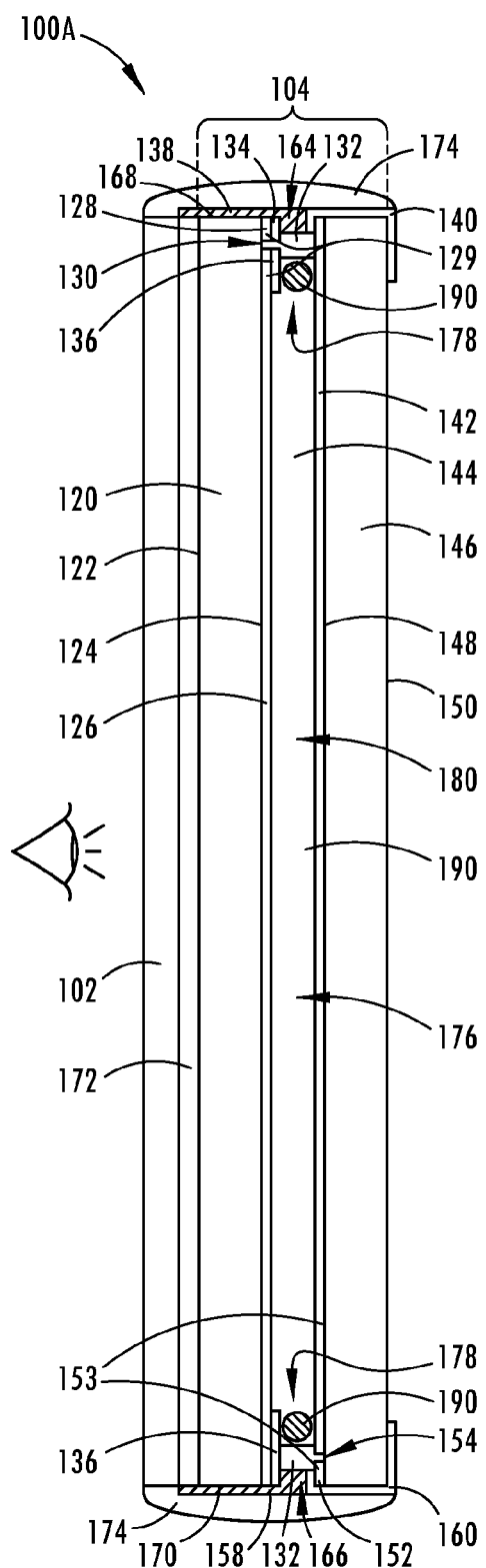
FIG. 2A        FIG. 2B

ELECTRO-OPTIC DEVICE

CROSS-REFERENCE TO RELATED APPLICATIONS

This application claims the benefit of and priority to U.S. Provisional Patent Application No. 61/881,941, filed on Sep. 24, 2013, entitled "ELECTRO-OPTIC DEVICE," the entire disclosure of which is hereby incorporated herein by reference.

FIELD OF THE DISCLOSURE

The present disclosure generally relates to an emissive display system, and more particularly, an emissive display system having an electro-optic device providing a selectively active background for a substantially transparent light emitting display.

BACKGROUND OF THE DISCLOSURE

Electro-optic assemblies are being used in various vehicular and building applications, e.g., within rearview display devices and variably transmissive windows. Use of these assemblies in various applications can be limited by cost, aesthetic and functional considerations. Accordingly, new electro-optic assembly designs, configurations and assemblies, along with methods of making them, are needed particularly in view of reducing material and processing costs, improving aesthetics and/or enhancing functionality.

SUMMARY OF THE PRESENT DISCLOSURE

According to one aspect of the present disclosure, an emissive display system includes an electro-optic device having a first substantially transparent substrate having first and second surfaces disposed on opposite sides thereof. At least one of the first and second surfaces includes a first electrically conductive layer. A second substantially transparent substrate includes third and fourth surfaces disposed on opposite sides thereof. At least one of the third and fourth surfaces includes a second electrically conductive layer. A primary seal is disposed around perimeter portions of the first and second substrates. The seal and the first and second substrates define a cavity therebetween. An electro-optic medium is disposed in the cavity. The electro-optic medium is variably transmissive such that the electro-optic device is operable between substantially clear and darkened states. A plurality of beads are disposed in a central portion of the cavity. The plurality of beads are configured to maintain a cell spacing between the first and second substrates. The plurality of beads are movable to a perimeter portion of the cavity. A substantially transparent light emitting display is disposed adjacent to the electro-optic device. The electro-optic device is in the darkened state when the light emitting display is emitting light.

According to another aspect of the present disclosure, an emissive display system includes an electro-optic device having a first substantially transparent substrate including first and second surfaces. At least one of the first and second surfaces includes a first electrically conductive layer. A second substantially transparent substrate is spaced apart from the first substrate. The second substrate includes third and fourth surfaces. At least one of the third and fourth surfaces includes a second electrically conductive layer. A primary seal is disposed around perimeter portions of the first and second substrates. The seal and the first and second substrates define a substantially hermetic cavity therebetween. An electro-optic medium is disposed in the cavity. The electro-optic medium is variably transmissive such that the electro-optic device is operable between substantially clear and darkened states. A plurality of substantially opaque beads is disposed in a central portion of the cavity. The beads are configured to separate the first and second substrates by a predetermined distance. The beads are substantially concealed when the electro-optic medium is in both the substantially clear and darkened states. A substantially transparent light emitting display is disposed adjacent to the electro-optic device. The electro-optic device is converted to the darkened state when the light emitting display is emitting light.

According to yet another aspect of the present disclosure, an emissive display system includes an electro-optic device having a first substantially transparent substrate including first and second surfaces. At least one of the first and second surfaces includes a first electrically conductive layer. A second substantially transparent substrate is spaced apart from the first substrate to define a cavity therebetween. The second substrate includes third and fourth surfaces. At least one of the third and fourth surfaces includes a second electrically conductive layer. An electro-optic medium is disposed in the cavity. The electro-optic medium is variably transmissive such that the electro-optic device is operable between substantially clear and darkened states. A plurality of spacing members is disposed within the electro-optic medium. The spacing members are configured to occlude light such that the electro-optic device maintains a substantially uniform transmissivity when the electro-optic medium is in the darkened state. A light emitting display is operably coupled to the electro-optic device. The electro-optic device is in the darkened state when the light emitting display is emitting light.

These and other aspects, objects, and features of the present disclosure will be understood and appreciated by those skilled in the art upon studying the following specification, claims, and appended drawings. It will also be understood that features of each embodiment disclosed herein may be used in conjunction with, or as a replacement for, features of the other embodiments.

BRIEF DESCRIPTION OF THE DRAWINGS

In the drawings:

FIG. 2A is a cross-sectional view of the emissive display system of FIG. 1 taken at line IIA, in accordance with an aspect of the disclosure;

FIG. 2B is a cross-sectional view of an emissive display system, in accordance with another aspect of the disclosure;

DETAILED DESCRIPTION OF EMBODIMENTS

Figure 1:
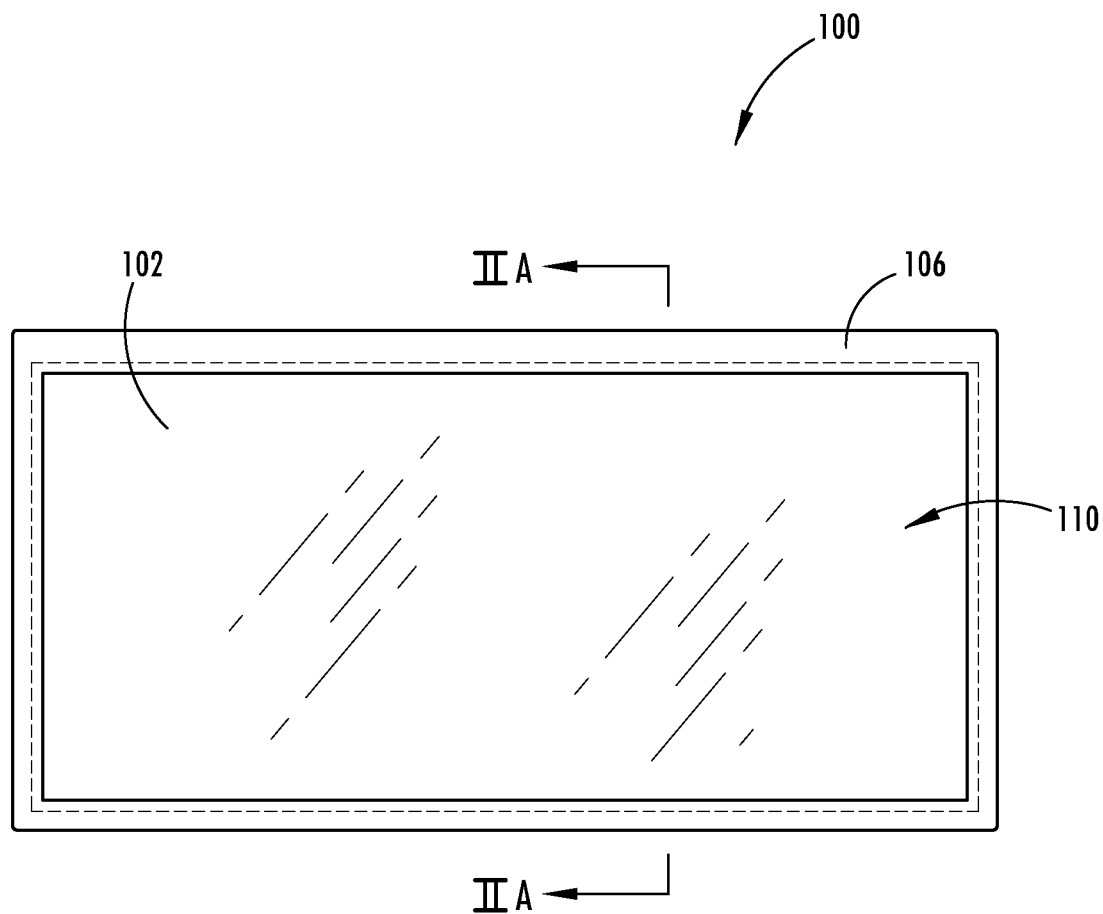
FIG. 1 is a front plan view of a an emissive display system according to one aspect of the disclosure.

The present illustrated embodiments reside primarily in combinations of method steps and apparatus components related to an electro-optic device. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Referring to FIGS. 1-4, an emissive display system 100 is depicted including a substantially transparent light emitting display (e.g., organic light emitting diode (OLED) display 102). The substantially transparent light emitting display may be the OLED display 102, a light emitting diode, a liquid-crystal display, an electroluminescent panel, a plasma display panel or other emissive display device. The emissive display system 100 is operable between a transparent window state in which the emissive display system 100 is substantially transparent, and a viewing panel state in which the emissive display system 100 displays an active image much like a television set. The transparent OLED display 102 can include a substantially dark (e.g., black) background to enhance OLED display 102 operation (e.g., visibility of emitted light and associated display image). According to at least one embodiment of the emissive display system 100, the transparent OLED display 102 can be used in conjunction with an electro-optic device 104 (e.g., an electrochromic device) to provide the substantially dark background. Typically, the electro-optic device 104 changes transmission states between a substantially clear state and a substantially dark or darkened state, as well as intermediate states thereto. The darkened state of the electro-optic device 104 is defined relative to the transmissivity of the substantially clear state. Typical transmissivity of the electro-optic device 104 in the substantially clear state is greater than about 50%, more desirably greater than about 55%, and most desirably above about 60%. Typical transmissivity of the electro-optic device 104 in the substantially darkened state is less than about 1%, more desirably less than about 0.1%, and most desirably less than about 0.001%. The emissive display system 100 can be configured such that the electro-optic device 104 is in the darkened state when the OLED display 102 is in an ON condition and emitting light. In this way, the electro-optic device 104 defines a substantially dark background to enhance the viewing of the OLED display 102. Conversely, the electro-optic device 104 can be in the substantially clear state when the OLED display 102 is in an OFF condition, or not emitting light, so that the emissive display system 100 defines a substantially transparent window. It is also contemplated that the OLED display 102 may be ON and emitting light while the electro-optic device 104 is in the substantially clear state.

Referring now to FIG. 1, the emissive display system 100 may include a bezel 106 disposed around a perimeter of the emissive display system 100. The bezel 106 may operate to conceal edges of the OLED display 102 and the electro-optic device 104. The bezel 106 may also house and/or conceal electronics and mounting hardware used in the operation of the emissive display system 100. The bezel 106 extends over the OLED display 102 and electro-optic device 104 to define a viewing pane 110 disposed centrally on the emissive display system 100. When emissive display system 100 is in the transparent window state, with the OLED display 102 in the off condition and the electro-optic device 104 in the substantially clear state, a viewer is able to look through the viewing pane 110, including the OLED display 102 and the electro-optic device 104, to observe objects behind the emissive display system 100. Thus, when emissive display system 100 is in the transparent window state it may function as a window of a house, office, automobile, airplane, or other vehicles and structures. When the emissive display system 100 is in the viewing panel state, with the OLED display 102 in the ON condition and the electro-optic device 104 in the darkened state, the viewer observes light emitted from the OLED display 102 in the form of a display image disposed within the viewing pane 110.

FIG. 2A depicts an enlarged cross sectional view of the emissive display system 100 of FIG. 1, without the bezel 106, to reveal greater detail. In the embodiment of FIG. 2A, the electro-optic device 104 comprises a first substrate 120 having a front or first surface 122 and a second surface 124. A first conductive electrode portion 126 and a second conductive electrode portion 128 applied to the second surface 124 cooperate to define a first electrically conductive layer 129. The first and second conductive electrode portions 126, 128 are substantially electrically insulated from one another via a first isolation area 130.

With further reference to FIG. 2A, the first isolation area 130 cooperates with a portion of a primary seal 132 to define the second conductive electrode portion 128 and a second spectral filter portion 134, each substantially electrically insulated from the first conductive electrode portion 126 and a first spectral filter portion 136. This configuration allows for placement of an electrically conductive material (e.g., a first conductive epoxy 138) adjacent to the primary seal 132 and along the first substrate 120. A first electrical clip 140 is in contact with the electrically conductive material 138 and is further in electrical communication with a third conductive electrode portion 142, the second conductive electrode portion 128, and an electro-optic medium 144 disposed within a cavity as further described below. The material, or composition of materials, forming the third conductive electrode portion 142, the first electrical clip 140 and the electrically conductive material 138 are chosen to promote durable electrical communication between the clip 140 and the materials leading to the electro-optic medium 144.

Referring again to FIG. 2A, the electro-optic device 104 is further includes a second substrate 146 having a third surface 148 and a rear or fourth surface 150. It should be noted that the first substrate 120 may be larger than the second substrate 146 to create an offset along at least a portion of the perimeter of the emissive display system 100 (or vice versa). Additionally or alternatively, one of the first and second substrates 120, 146 may have an approximately 26 inch to about 70 inch diagonal, an approximately 12.7 inch to about 34.3 inch height, and an approximately 22.7 inch to about 61 inch width, or a combination thereof. In one embodiment, at least one of the first substrate and the second substrates 120, 146 can include a body portion having an approximately 60 inch diagonal, an approximately 52 inch width, and an approximately 29 inch height. The third conductive electrode portion 142 and a fourth conductive electrode portion 152 are shown proximate the third surface 148 substantially electrically insulated via a second isolation area 154. The third and fourth conductive electrode portions 142, 152 cooperate to define a second electrically conductive layer 153.

Referring again to FIG. 2A, the second isolation area 154 cooperates with a portion of the primary seal 132 to define the fourth conductive electrode portion 152 that is substantially electrically insulated from the third conductive electrode portion 142. This configuration allows for placement of an electrically conductive material (e.g., a second conductive epoxy 158) adjacent to the primary seal 132. A second electrical clip 160 is in electrical communication with the first spectral filter portion 136, the first conductive electrode portion 126 and the electro-optic medium 144 disposed within a cavity as further described below. Preferably, the material, or composition of materials, forming the first conductive electrode portion 126, the second electrical clip 160, the first spectral filter portion 136 and the electrically conductive material 158 are chosen to promote durable electrical communication between the second electrical clip 160 and the materials leading to the electro-optic medium 144.

Still referring to FIG. 2A, the electrically conductive material 138, 158 is applied to outer edge portions 164, 166 of the electro-optic device 104, outboard from the primary seal 132, thereby electrically connecting the first and second electrically conductive layers 129, 153. By way of example and not limitation, the electrically conductive material 138, 158 may be a conductive solder, a conductive epoxy (e.g., silver epoxy), a wire or other material capable of electrical signal transfer. In some embodiments, the first substrate 120 may include at least one electrical clip similar to the first and second electrical clips 140, 160 of the second substrate 146. In such an embodiment, the first and second conductive materials 138, 158 would no longer electrically connect the first and second electrically conductive layers 129, 153, thereby eliminating the need for the first and second isolation areas 130, 154.

Still referring to FIG. 2A, the electrically conductive material 138, 158 may be applied along outboard edges 168, 170 of the first substrate 120 in a direction toward the first surface 122 so as to electrically connect a third electrically conductive layer 172 with the first and second electrical clips 140, 160. The third electrically conductive layer 172 is disposed on the first surface 122 of the first substrate 120, such that the first substrate 120 is a dual coated substrate having electrically conductive layers 129, 172 deposed on first and second surfaces 122, 124. As shown in FIG. 2A, the substantially transparent OLED display 102 is coupled to and receives power from the third electrically conductive layer 172, such that the OLED display 102 is operably coupled to the electro-optic device 104. Typically, traditional OLED displays include both a glass substrate on which to lay an OLED/electrode layer and a cover glass portion protecting the OLED display 102 from oxygen. By utilizing the first surface 122 of the first substrate 120 as a shared carrier for both the third electrically conductive layer 172 and the OLED display 102, weight savings as well as decreased manufacturing and material costs are achieved compared to the manufacture and assembly of separate components. It should be understood that the third electrically conductive layer 172 and the OLED display 102 may alternatively or additionally be added to the fourth surface 150, such that the second substrate 146 is also configurable as a dual coated substrate. In such an embodiment, the electrically conductive material and/or the first and second electrical clips 140, 160 contact the third electrically conductive layer 172 on the fourth surface 150 in a manner as described above with reference to the first substrate 120.

In an alternative embodiment, the OLED display 102 may instead be disposed adjacent to the first surface 122 of the first substrate 120 with the third electrically conductive layer 172 located on top of the OLED display 102 against a cover glass. The conductive material may be applied along the OLED display 102 in a similar manner to that of the outboard edges 168, 170 of the first substrate 120 to reach the third electrically conductive layer 172. Such an embodiment may be advantageous depending on the direction of the emission of light i.e., whether the OLED display 102 is a top or bottom emission display device.

Still referring to FIG. 2A, in certain aspects of the emissive display system 100, a perimeter material 174 is disposed on one or more edges of the first and second substrates 120, 146, the OLED display 102, the conductive material, and/or electrical clips 140, 160. The perimeter material 174, when present in the emissive display system 100, is selected to provide visible edge surfaces along the substrates that are visually appealing while also providing adhesion between the edges of the electro-optic device 104 and the OLED display 102. In embodiments incorporating a bezel such as the bezel 106 (FIG. 1), the perimeter material 174 may be omitted in assembly because the one or more edges of the first and second substrates 120, 146 would be concealed from the viewer by the bezel 106.

Still referring to FIG. 2A, the primary seal 132 traverses an approximate perimeter of and is configured to cooperate with the first and second substrates 120, 146 to define a substantially hermetic cavity 176 disposed between the first and second substrate 120, 146. It should be understood that the primary seal 132 may be applied to the first or second substrates 120, 146 by means commonly used in the liquid crystal display (LCD) industry, such as by silk-screening or dispensing. The electro-optic medium 144 is disposed within the cavity 176, as shown in FIG. 2A. The primary seal 132, may include a plug that is used to finally seal the cavity 176 after the cavity 176 is substantially filled with the electro-optic medium 144. As shown, the cavity 176 includes both a perimeter portion 178 and a central portion 180. The perimeter portion 178 is located proximate to the primary seal 132 in assembly. The first spectral filter portion 136 extends inboard from the primary seal 132 into the perimeter portion 178 of the cavity 176 sufficiently far enough to generally conceal the primary seal 132 from the viewer. The central portion 180 of the cavity 176 shares approximately the same foot print as the viewing pane 110 defined by the bezel 106 as described in FIG. 1.

According to at least one embodiment, the electro-optic medium 144 is an electrochromic medium. The electrochromic medium can comprise at least one solvent, at least one anodic material, and at least one cathodic material. Typically, both of the anodic and cathodic materials are electroactive and at least one of them is electrochromic. The term "electroactive" can be a material that undergoes a modification in its oxidation state upon exposure to a particular electrical potential difference, and/or the term "electrochromic" can be a material that exhibits a change in its extinction coefficient at one or more wavelengths upon exposure to a particular electrical potential difference, according to one or more embodiments.

The electrochromic medium can be one of the following categories:

(I) Single-layer, single-phase—The electrochromic medium may comprise a single-layer of material which may include small non-homogenous regions, and include solution-phase devices where a material may be contained in solution in an ionically conducting electrolyte which remains in solution in the electrolyte when electrochemically oxidized or reduced. Solution-phase electroactive materials may be contained in the continuous solution-phase of a gel medium in accordance with the teachings of U.S. Pat. No. 5,928,572 entitled "Electrochromic Layer And Devices Comprising Same," and International Patent Application Serial No. PCT/US98/05570 entitled "Electrochromic Polymeric Solid Films, Manufacturing Electrochromic Devices Using Such Solid Films, And Processes For Making Such Solid Films And Devices," both of which are hereby incorporated herein by reference in their entirety.

More than one anodic and cathodic material can be combined to give a pre-selected color as described in U.S. Pat. No. 5,998,617 entitled "Electrochromic Compounds," U.S. Pat. No. 6,020,987 entitled "Electrochromic Medium Capable Of Producing A Pre-selected Color," U.S. Pat. No. 6,037,471 entitled "Electrochromic Compounds," and U.S. Pat. No. 6,141,137 entitled "Electrochromic Media For Producing A Pre-selected Color," all of which are hereby incorporated herein by reference in their entirety including all references incorporated and/or cited therein.

The anodic and cathodic materials may also be combined or linked by a bridging unit as described in U.S. Pat. No. 6,241,916 entitled "Electrochromic System" and/or U.S. Patent Publication No. 2002/0015214 A1 entitled "Electrochromic Device," which are hereby incorporated herein by reference in their entirety including all references incorporated and/or cited therein. The electrochromic materials may also include near-infrared (NIR) absorbing compounds as described in U.S. Pat. No. 6,193,912 entitled "Near Infrared-Absorbing Electrochromic Compounds And Devices Comprising Same," which is hereby incorporated herein by reference in its entirety including all references incorporated and/or cited therein.

It is also possible to link anodic materials or cathodic materials by similar methods. The concepts described in these patents can further be combined to yield a variety of electroactive materials that are linked or coupled, including linking of a redox buffer, such as linking of a color-stabilizing moiety, to an anodic and/or cathodic material.

The anodic and cathodic electrochromic materials can also include coupled materials as described in U.S. Pat. No. 6,249,369 entitled "Coupled Electrochromic Compounds With Photostable Dication Oxidation States," which is hereby incorporated herein by reference in its entirety including all references incorporated and/or cited therein.

The concentration of the electrochromic materials can be selected as taught in U.S. Pat. No. 6,137,620 entitled "Electrochromic Media With Concentration Enhanced Stability, Process For The Preparation Thereof and Use In Electrochromic Devices," which is hereby incorporated herein by reference in its entirety including all references incorporated and/or cited therein.

Additionally, a single-layer, single-phase medium may include a medium where the anodic and cathodic materials are incorporated into a polymer matrix as is described in International Patent Application Serial No. PCT/EP98/03862 entitled "Electrochromic Polymer System," and International Patent Application Serial No. PCT/US98/05570 entitled "Electrochromic Polymeric Solid Films, Manufacturing Electrochromic Devices Using Such Solid Films, And Processes For Making Such Solid Films And Devices," which is hereby incorporated herein by reference in its entirety including all references incorporated and/or cited therein.

(II) Multi-layer—The electrochromic medium may also be prepared in layers and include a material attached directly to an electrically conducting electrode or confined in close proximity thereto which remains attached or confined when electrochemically oxidized or reduced.

(III) Multi-phase—The electrochromic medium may further be prepared using multiple phases where one or more materials in the medium undergoes a change in phase during the operation of the device. For example a material contained in solution in the ionically conducting electrolyte forms a layer on the electrically conducting electrode when electrochemically oxidized or reduced.

Referring again to the embodiment of FIG. 2A, one or more beads 190 may be disposed in the cavity 176 to maintain an approximately equal cell spacing between the first substrate 120 and the second substrate 146 within the electro-optic device 104. In the assembly and manufacture of electro-optics devices, beads, such as beads 190, may be disposed in the central portion 180 of the cavity 176 by affixing the beads 190 to either the second or third surfaces 124, 148 of either the first or second substrates 120, 146. The beads 190 may be positioned inboard of the primary seal 132 to temporarily maintain proper cell spacing of the cavity 176 during the manufacturing process prior to and during curing of the primary seal 132. In assembly, and as shown in FIG. 2A, the beads 190 about the second and third surfaces 124, 148 act to physically separate the first and second substrates 120, 146 thereby setting the cell spacing of the cavity 176 as the largest dimension of the beads 190. The beads 190 are particularly useful in the manufacture of electro-optic devices having large or thin substrates, as the beads 190 help prevent distortion and double image during device manufacture given the structural rigidity of the beads. This rigidity maintains a uniform cell spacing between the substrates 120, 146 until gelation of the electro-optic medium 144 occurs. The use of beads 190 is also advantageous from a cost savings standpoint, as the beads 190 are a cost effective way to maintain cell spacing without the use of highly specialized equipment.

The cavity 176 of the electro-optic device 104 can be configured to have an approximately 0.5 millimeter cell spacing, or spacing between the first substrate 120 and the second substrate 146, according to at least one embodiment. In such an embodiment, the beads 190 are configured to be approximately 0.5 millimeters in height and/or diameter. Generally, the beads 190 are used to maintain cell spacing for a relatively short period of time during the manufacture of an electro-optic device. Thus, the beads 190 should have a diameter or largest dimension equal to or slightly greater than a desired cell spacing for the electro-optic device 104. Selection of properly sized beads can be accomplished by sieving through successive screens to obtain a desired size. The diameter of the beads 190 may be about 100 microns to about 2000 microns, and more desirably, between about 250 microns to about 1000 microns. By way of explanation and not limitation, the beads 190 may be in a column or pillar orientation as shown in FIG. 2A, or the beads 190 may also have a substantially round or spherical orientation. It will be understood by one having ordinary skill in the art that the beads 190 described throughout this disclosure can be replaced by any form of spacing member having a configuration that is not substantially spherical, but may be substantially cubic, conical, cylindrical, rectangular, pyramid shaped, randomly formed by a printing technique, or any other configuration appropriate to maintain the cell spacing.

The beads 190 can be approximately uniform in color. In some embodiments, the beads 190 may be substantially dark and consistent with the color of the electro-optic device 104 in the darkened state. The beads 190 may also be substantially opaque, such that when the electro-optic device 104 is in the darkened state, the beads 190 do not result in points of high transmissivity of light. Thus, when the beads 190 are opaque, the electro-optic device 104 maintains a substantially uniform level of transmissivity of light while in the darkened state.

The beads 190 can include glasses, polymers, ceramics, organics, inorganics, salts and other suitable non-conductive materials, or combinations thereof. For example, the beads 190 may be substantially composed of a polymethyl methacrylate material. Additionally, the beads 190 can be colored, clear, or opaque and may further be configured to vary in transmissivity to control the amount or wavelength of light that propagates through the beads 190. For example, in embodiments where the beads 190 are composed of glass, the glass may be basalt, such that optical light is occluded from passing through the beads 190. In embodiments where the beads 190 include clear plastics or light colored ceramics, the beads 190 may be dyed a dark color to occlude light and provide a substantially uniform color for the electro-optic device 104 in the darkened state.

Additionally, the beads 190 may comprise a variety of other electromagnetic properties. For example, the beads 190 may be magnetic, paramagnetic, ferromagnetic, diamagnetic, electrically charged, or otherwise responsive to the generation and manipulation of electromagnetic fields for movement within the cavity 176, as further described below.

Typically, the beads 190 are loaded into a "salt shaker" type dispenser. When applying the beads 190 to a substrate, either the first or second substrate 120, 146 is laid flat with the electrode coated side facing upward. The beads 190 are then randomly distributed onto the second or third surfaces 124, 148 using the salt shaker dispenser to a concentration of about 5 to 10 beads per square centimeter. Additionally, the beads 190 can be printed onto a surface of one of the substrates, using a three-dimensional printing technique or other like additive manufacturing process.

Still referring to FIG. 2A, in some embodiments, the beads 190 may remain in the central portion 180 of the cavity 176 after curing of the primary seal 132 and during gelation of the electro-optic medium 144. In such embodiments, dark beads 190 having substantially the same color as the electro-optic device 104 in the darkened state are desired. Typically, dark colored beads 190 positioned in the central portion 180 of the cavity 176 are visible in the viewing pane 110 by the viewer; however, typical viewing distances for large emissive displays and windows are of such a distance that dark colored beads of a predetermined size are substantially undetected under typical viewing conditions. For example, with the emissive display system 100 in the transparent window state, a viewer would generally not detect the presence of the dark beads 190 due to the small bead size and the viewer's distance to the viewing pane 110. In this state, the viewing pane 110 appears as a substantially transparent window. Similarly, the opacity and the dark color of the beads 190 would occlude light from passing through the electro-optic device 104, such that when the electro-optic device 104 is in the darkened state, it has a substantially uniform light transmissivity. Thus, the beads 190 generally blend with the electro-optic device 104, such that the viewer would not observe high points of transmissivity or "pinpricks" of light passing through the emissive display system 100. With the beads 190 not readily visible in either the transparent window state or the viewing panel state, the beads 190 are thus substantially concealed from the viewer in both the substantially clear and darkened states of the electro-optic device 104.

Referring now to FIG. 2B, another embodiment of an emissive display system 100A is shown having one or more beads 190 disposed on their side in the perimeter portion 178 of the cavity 176. Once the primary seal 132 is cured, the beads 190 of emissive display system 100A can be moved to the perimeter portion 178 of the cavity 176 at or proximate to the primary seal 132. The beads 190 may be movable to the perimeter portion 178 of the cavity 176, such that the beads 190 are removed or dispersed outside of the viewing pane 110, thus concealing the beads 190 from the viewer. For example, once moved to the perimeter portion 178, the beads 190 may come to rest under the first and second spectral filter portions 136, 134 and be concealed from the viewer. In another example, the beads 190 may be moved under the bezel 106 (FIG. 1), such that the viewer does not see the beads 190 in assembly. In embodiments where the beads 190 are concealed under the bezel 106, the first and second spectral filter portions 136, 134 may be omitted in assembly.

Referring again to FIG. 2B, according to one embodiment, the beads 190 may be moved magnetically from the central portion 180 of the cavity 176 to the perimeter portion 178 of the cavity 176. In such an embodiment, the beads 190 may be composed of a material responsive to electromagnetic fields, such as a paramagnetic polymer or a ferromagnetic polymer, and positioned in the central portion 180 of the cavity 176. After the seal 132 is cured, an electromagnetic field may be generated and manipulated in order to generate a magnetic force on the beads 190. The magnetic force may be used to attract or repel the beads 190 towards the perimeter portion 178 of the cavity 176, such that they are substantially concealed (e.g., under the spectral filter portions 136, 134 or bezel 106) from the viewer.

With further reference to FIG. 2B, according to another embodiment, the beads 190 may be gravitationally moved from the central portion 180 of the cavity 176 to the perimeter portion 178. After curing of the primary seal 132 and the filling of the cavity 176 with the electro-optic medium 144, the electro-optic device 104 may be positioned in a vertical orientation. The vertical orientation of the electro-optic device 104 causes the yet ungelled electro-optic medium 144 to generate an outwardly oriented hydrostatic force within the electro-optic device 104. The outwardly oriented hydrostatic force minutely increases the cell spacing in the cavity 176 allowing the beads 190 to gravitationally descend to the perimeter portion 178 of the cavity 176 proximate to the primary seal 132. In an alternative embodiment, prior to filling the cavity 176 with electro-optic medium 144, but after curing of the primary seal 132, a burst of air may be introduced to the cavity 176. The burst of air generates an outwardly oriented force, similarly to that of the hydrostatic force, allowing the beads 190 to gravitationally descend towards the perimeter portion 178 of the cavity 176. In this embodiment, the beads 190 may then be removed from the cavity 176.

Additionally, the introduction of the electro-optic medium 144 to the cavity 176 may itself aid in the movement of the beads 190. As the electro-optic medium 144 moves through the cavity 176, it may pillow the substrates 120, 146, or slightly increase the cell spacing, allowing the beads 190 to be moved to the perimeter portion 178. The remaining beads 190 in the cavity 176 may then be moved using one of the methods outlined above.

Figure 2C:
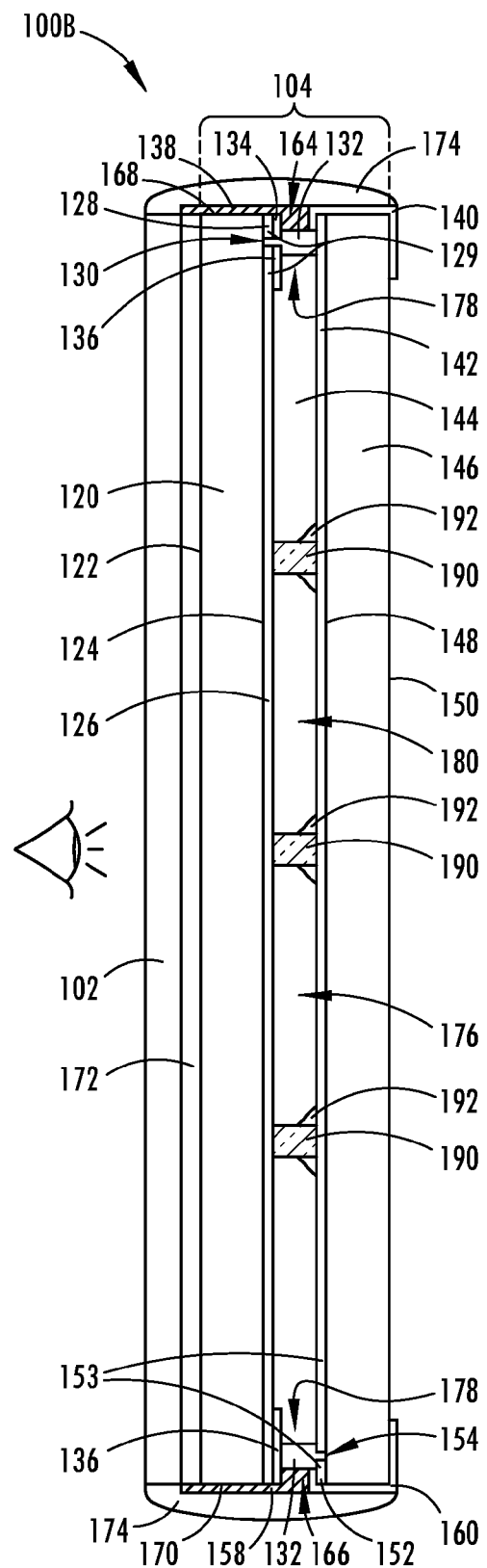
FIG. 2C is a cross-sectional view of an emissive display system, in accordance with another aspect of the disclosure.

Referring now to another embodiment of the emissive display system 100B shown in FIG. 2C, the usage of beads 190 in the electro-optic device 104 may be optimized by placing the beads 190 in predetermined locations. The predetermined locations may correspond to a grid pattern, a gradient pattern, circular pattern, striped pattern or another arrangement based on localized support needs between the first and second substrates 120, 146 during the manufacturing process. Rigidity of the electro-optic device 104 may also be considered in determining the location of the beads 190. The beads 190 may be held in place in predetermined locations with the use of a retaining medium 192. The retaining medium 192 is contemplated to be a semiliquid or a partially solidified material. The retaining medium 192 is contemplated to be a crosslinked or high viscosity polymer with adhesive properties. In some embodiments, the retaining medium 192 may include one or more of the constituents of the electro-optic medium 144 (e.g., propylene carbonate). Embodiments utilizing a constituent of the electro-optic medium 144 are advantageous as they avoid poisoning or tainting of the electro-optic medium 144 with foreign substances while simultaneously holding the beads 190 in place. In one embodiment, a plurality of basalt glass beads 190 are dispensed in predetermined grid pattern on the third surface 148 of the second substrate 146 using propylene carbonate as the retaining medium 192. Additionally, once the cavity 176 has been filled with electro-optic medium 144, but prior to gelation, the retaining medium 192 may dissolve into the electro-optic medium 144, thereby freeing the beads 190 to be moved from the central portion 180 of the cavity 176 to the perimeter portion 178 using one of the moving methods outlined above.

Figure 3A:
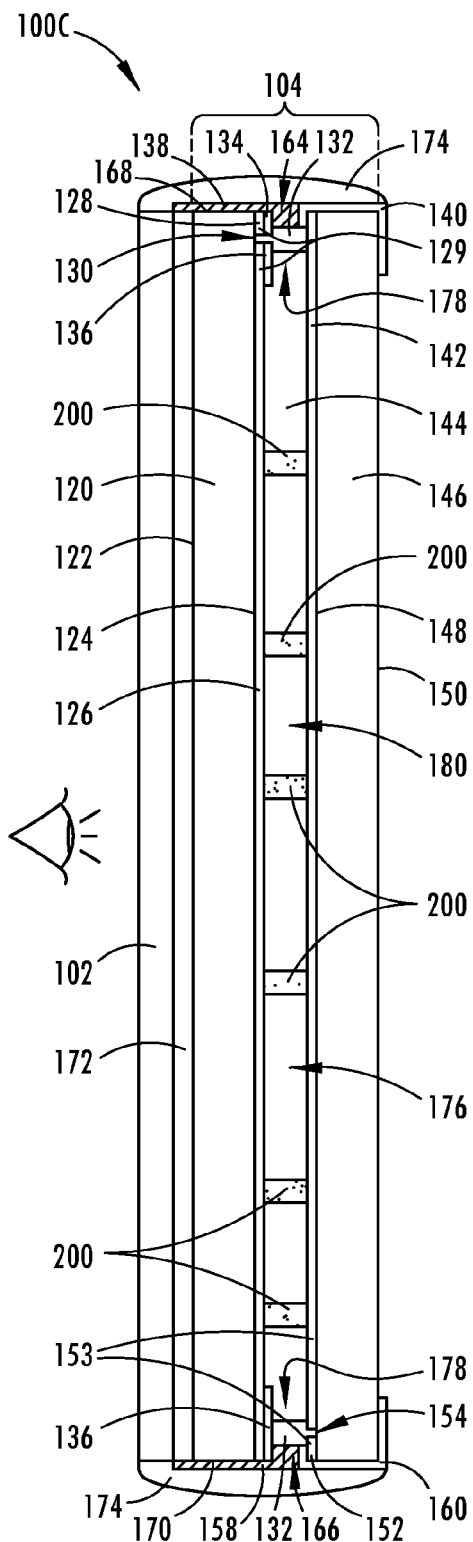
FIG. 3A is a cross-sectional view of an emissive display system, in accordance with another aspect of the disclosure.

Referring now to FIG. 3A, in one embodiment of the emissive display system 100C, spacer members, such as pre-formed polymer matrix discs 200, can be used to maintain an approximate cell spacing between the first and second substrates 120, 146. The polymer matrix discs 200 may be sufficiently crosslinked, thereby providing the rigidity to maintain the cell spacing between the first and second substrates 120, 146 during manufacturing. The pre-formed polymer matrix discs 200 are generally formed of crosslinked polymer chains. The polymer chains contain functional groups that will allow for additional crosslinking, like hydroxyls, amines, isocyanates, isothiocyanates, and/or glycidyls. The polymer chains of the polymer matrix maybe from the following classes of polymers: polyacrylate, polymethacrylates, polyethers, polyesters, polycarbonates, polyvinylesters, polyurethanes, polysiloxanes, polysilanes, polyacrylonitriles, polystyrenes, polymethacrylonitriles, polyamides, polyimides, polyvinylidenehalides, and co-polymer and combinations of thereof. The polymer chains of the pre-formed polymer matrix discs 200 may be crosslinked by reaction with a compound having a functional group selected from the group consisting of aromatic and aliphatic hydroxyl; aromatic and aliphatic amines; aromatic and aliphatic isocyanato; aliphatic and aromatic isothiocyanato and aromatic and aliphatic glycidyls. Further examples of polymer matrix materials can be found in U.S. Pat. Nos. 6,635,194 and 5,940,201, which are hereby incorporated by reference in their entirety including all references incorporated and/or cited therein. The pre-formed polymer discs 200 may have a diameter ranging from about 0.5 to about 1.5 centimeters and more desirably about 1 centimeter. The pre-formed polymer matrix discs 200 may also include a height ranging from about 0.25 millimeters to about 1 millimeter, and more desirably about 0.5 millimeters. The polymer matrix discs 200 are substantially transparent, and thus, substantially undetectable in assembly. The pre-formed polymer discs 200 may be distributed on to the second or third surfaces 124, 148 in a similar manner to that described above with reference to the beads 190. For example, the discs 200 may be randomly distributed or may be placed in a predetermined pattern based on spacing and rigidity needs of the electro-optic device 104.

With further reference to FIG. 3A, in one embodiment, the polymer matric discs 200 are formed without an electroactive material. During assembly, an electroactive material from the electro-optic medium 144 can be diffused into the polymer matrix discs 200. The presence of electroactive material (e.g., electrochromic material) within the polymer matrix discs 200 permits the polymer matrix discs 200 to be variably transmissive, in a manner similar to the electro-optic medium 144. Additionally, the polymer matrix discs 200 may be formed with the electroactive material (e.g., electrochromic material) pre-impregnated into the polymer matrix discs 200, with additional electroactive material diffusing inwardly from the electro-optic medium 144 prior to gelation of the electro-optic medium 144. The polymer matrix discs 200 are substantially concealed from the viewer in both the substantially clear and darkened states of the electro-optic device 104 due to the variable transmissivity imparted by the electroactive material diffused or impregnated therein.

Figure 3B:
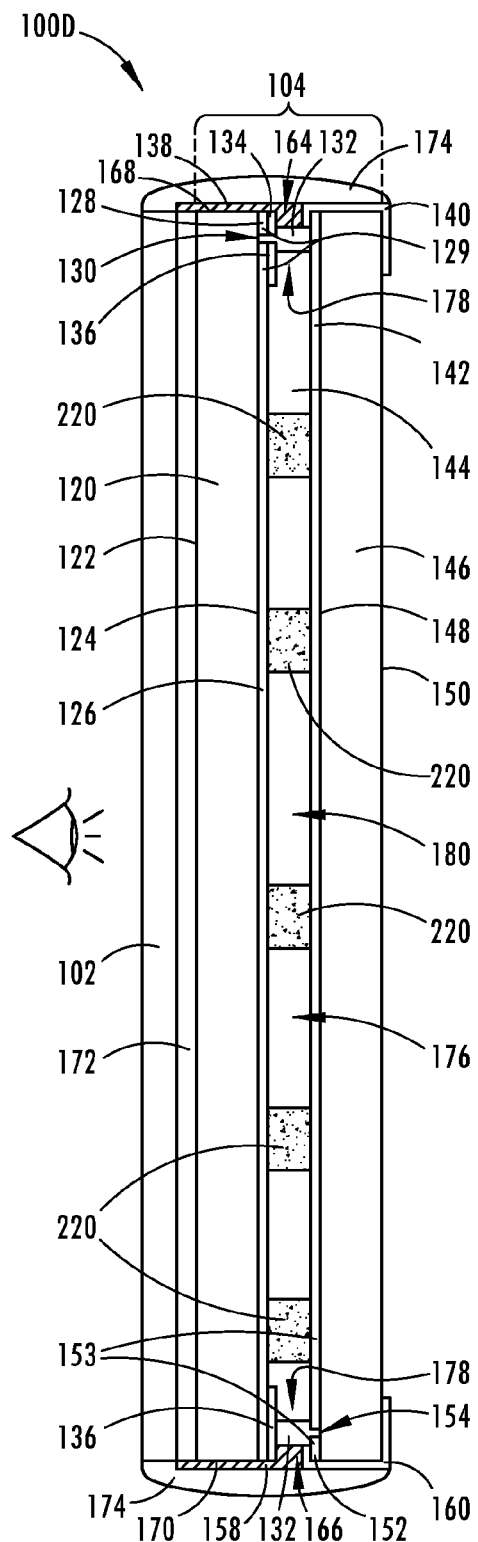
FIG. 3B is a cross-sectional view of an emissive display system, in accordance with another aspect of the disclosure.

Referring now to FIG. 3B, in at least one embodiment of the emissive display system 100D, the spacing members may be in the form of gel deposits 220 which act to maintain the appropriate cell spacing of the cavity 176 between the first and second substrates 120, 146. The gel deposits 220 may include a crosslinked polymer matrix, a free-standing gel or a substantially non-weeping gel. In an alternative embodiment, the gel deposit 220 may comprise non-cross linked polymers in order to speed dissolution of the deposit 220 into the electro-optic medium 144. It is contemplated that the gel deposits 220 comprise a semi-solubilized plastic mixture configured to maintain cell spacing and dissolve upon association with a solvent from the electro-optic medium 144.

Referring again to FIG. 3B, the gel deposits 220 may be a plastic mixture including a polymeric component selected from the group consisting of a polymethyl methacrylate component, a poly(propylene carbonate) component and combinations and co-polymers thereof. Similarly, the gel deposits 220 may include a polymeric component comprising a backbone selected from the group consisting of polyamides, polyimides, polycarbonates, polyesters, polyethers, polymethacrylates, polyacrylates, polysilanes, polysiloxanes, polyvinylacetates, polymethacrylonitriles, polyacrylonitriles, polyvinylphenols, polyvinylalcohols, polyvinylidenehalides, and co-polymers and combinations thereof. In assembly, the gel deposits 220 are configured to remain substantially rigid after filling the cavity 176 with the electro-optic medium 144 to provide support for electro-optic device 104. In another embodiment, the gel deposits 220 are configured to substantially dissolve into the electro-optic medium 144 prior to crosslinking of the electro-optic medium 144. In such an embodiment, the gel deposits 220 function as a "sacrificial spacing member" to maintain the cell spacing of the cavity 176 and then substantially dissolve into the electro-optic medium 144 upon association with the same.

Figure 4:
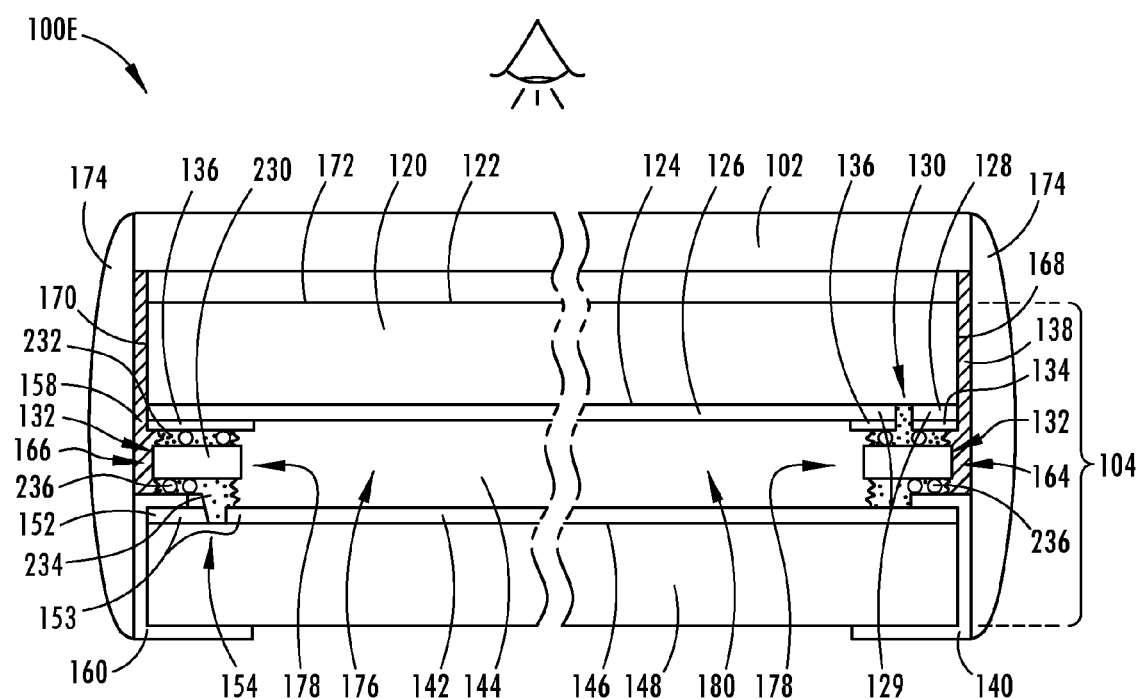
FIG. 4 is an enlarged, cross-sectional view of an emissive display system, in accordance with yet another aspect of the disclosure.

Depicted in FIG. 4 is another embodiment of the primary seal 132 of an emissive display system 100E, shown in an enlarged, cross-sectional format to provide additional detail associated with salient features of the various, exemplary embodiments of this disclosure. In this embodiment, the primary seal 132 includes a gasket 230 disposed between a first epoxy layer 232 and a second epoxy layer 234. In the depicted embodiment, the gasket 230 may extend through the width of the primary seal 132 to the edge of the first and second substrates 120, 146 and make contact with the conductive material (e.g., conductive epoxy 138, 158). In other embodiments, the gasket 230 may terminate within the primary seal 132 (i.e., the first or second epoxy layers 232, 234 may envelop an outboard and/or inboard edge of the gasket 230). The gasket 230 and primary seal 132 are configured to be substantially concealed when used in embodiments where the emissive display system 100E includes first and second spectral filter portions 136, 134 or a bezel, such as bezel 106 shown in FIG. 1.

Referring again to FIG. 4, the gasket 230 extends around the first and second substrates 120, 146 within the primary seal 132. The gasket 230 may be a unitary structure, as depicted, or be composed of several pieces. In embodiments where the gasket 230 is composed of multiple pieces, the pieces may be joined via butt joints, miter joints, splice joints, or other known methods of joining gaskets. The gasket 230 has a thickness which may range from about 100 microns to about 2000 microns, and more desirably range from about 250 microns to about 1000 microns. The gasket 230 is composed of a material which is both an electrical insulator and promotes a hermetic environment within the cavity 176 (i.e., prevents the diffusion of oxygen and moisture vapor from an external environment to the cavity 176). Suitable materials for the gasket 230 may include glasses, plastics, ceramics or combinations thereof. According to at least one embodiment, one or more borosilicate glass strips can be used to form the gasket 230. In such an embodiment, the cavity 176 would be expected to have an increased hermaticity due to the replacement of an epoxy with a glass gasket 230, as further described below. In some embodiments, the gasket 230 may be configured to function as an electrical bus extending around a perimeter of the electro-optic device 104. In such embodiments, the gasket 230 is coated with an electrically conductive metal (e.g., silver, copper, gold), polymer, or combination thereof. The gasket 230, when functioning as an electrical bus, may be electrically connected to the first or second electrically conductive layers 129, 153 by modifying one or both of the first and second electrical clips 140, 160 to make contact with the gasket 230. Additionally or alternatively, a wire may be disposed in the first or second epoxy layers 232, 234 to create an electrical connection between the gasket 230 and the first or second electrically conductive layers 129, 153. It should be understood that the methods of creating the electrical connection between the gasket 230 and the conductive layers 129, 153 outlined above are exemplary in nature and are not intended to be limiting.

With further reference to FIG. 4, disposed within the first and second epoxy layers 232, 234 are one or more seal spacer beads 236. The seal spacer beads 236 are used to help define the cell spacing of the cavity 176 in the electro-optic device 104. Traditional epoxy seals typically have a higher coefficient of thermal expansion as compared to seals having a glass spacer media included within the epoxy. In seals that include a high temperature curing step followed by a cool down phase, the difference in coefficients of thermal expansion between the epoxy and the spacer media can lead to high stresses in the epoxy which results in delamination of the epoxy from larger (i.e., greater than about 250 microns) spacing media. However, the introduction of the gasket 230 permits the use of spacing beads 236 of a smaller size i.e., less than about 250 microns while still producing electro-optic devices 104 with a sufficiently large cell spacing. In this embodiment, the gasket 230 acts as a filler between the first and second substrates 120, 146, such that spacing beads 236 of a smaller diameter, which do not suffer from the same delamination issues outlined above, may be used in the epoxy.

Still referring to FIG. 4, the seal spacing beads 236 may be composed of a polymer, a glass, a ceramic, or other suitable hermetic and non-conductive media. Alternatively, in embodiments where the gasket 230 is functioning as an electrical bus, the seal spacing beads 236 may be coated in or include an electrically conductive metal so as to provide an electrical connection between the electrical clips 140, 160, the gasket 230, and the first or second electrically conductive layers 129, 153 using the spacing beads 236. The spacer beads 236 may range in diameter from about 1 micron to about 250 microns, and more desirably from about 50 microns to about 100 microns. In assembly, the seal spacing beads 236 are configured to define the spacing between the laminated first and second substrates 120, 146. The spacing beads 236 may be placed into the first and second epoxy layers 232, 234 (e.g., before or after the seal material is dispensed within the emissive display system 100E and cured) or applied to the first or second substrates 120, 146 prior to joining of the substrates.

Examples are described in U.S. Pat. Nos. 6,700,692, 7,372, 611, and 8,169,684, and U.S. patent application Ser. Nos. 12/496,620, 12/774,721, 13/395,069 and 13/470,147, all of which are hereby incorporated herein by reference in their entirety.

The present disclosure may be used with a display system such as that described in U.S. Pat. Nos. 8,201,800; 8,210,695; U.S. patent application Ser. Nos. 13/600,496; 13/527,375; 13/431,657; 13/402,701; 12/187,019, and U.S. Provisional Patent Application Nos. 61/709,716; 61/707,676; and 61/704, 869, which are hereby incorporated herein by reference in their entirety. Further, the present disclosure may be used with a rearview packaging assembly such as that described in U.S. Pat. No. 8,264,761; U.S. patent application Ser. Nos. 13/567,363; 13/405,697; 13/402,701; and 13/171,950, and U.S. Provisional Patent Application Nos. 61/707,625; and 61/590,259, which are hereby incorporated herein by reference in their entirety. Additionally, it is contemplated that the present disclosure can include another bezel such as that described in U.S. Pat. Nos. 8,201,800; 8,210,695; and U.S. patent application Ser. No. 13/271,745, which is hereby incorporated herein by reference in its entirety.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims as interpreted according to the principles of patent law, including the doctrine of equivalents.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. An emissive display system, comprising:
    an electro-optic device comprising:
        a first substantially transparent substrate having first and second surfaces disposed on opposite sides thereof, wherein at least one of the first and second surfaces comprises a first electrically conductive layer;
        a second substantially transparent substrate having third and fourth surfaces disposed on opposite sides thereof, wherein at least one of the third and fourth surfaces comprises a second electrically conductive layer;
        a primary seal disposed around perimeter portions of the first and second substrates, wherein the seal and the first and second substrates define a cavity therebetween;
        an electro-optic medium disposed in the cavity, the electro-optic medium being variably transmissive such that the electro-optic device is operable between substantially clear and darkened states; and
        a plurality of beads disposed in a central portion of the cavity, the plurality of beads being configured to maintain a cell spacing between the first and second substrates, wherein the plurality of beads comprises a plurality of paramagnetic or ferromagnetic beads and are movable to a perimeter portion of the cavity; and
    a substantially transparent light emitting display disposed adjacent to the electro-optic device, wherein the electro-optic device is in the darkened state when the light emitting display is emitting light, wherein the plurality of beads is moved to the perimeter portion of the cavity by the following steps:
        (a) generating a magnetic field;
        (b) manipulating the magnetic field such that a force is generated on the plurality of paramagnetic or ferromagnetic beads; and
        (c) applying said force to move the plurality of paramagnetic or ferromagnetic beads to a position proximate the primary seal along the perimeter of the cavity.

2. An emissive display system, comprising:
    an electro-optic device comprising:
        a first substantially transparent substrate having first and second surfaces disposed on opposite sides thereof, wherein at least one of the first and second surfaces comprises a first electrically conductive layer;
        a second substantially transparent substrate having third and fourth surfaces disposed on opposite sides thereof, wherein at least one of the third and fourth surfaces comprises a second electrically conductive layer;
        a primary seal disposed around perimeter portions of the first and second substrates, wherein the seal and the first and second substrates define a cavity therebetween;
        an electro-optic medium disposed in the cavity, the electro-optic medium being variably transmissive such that the electro-optic device is operable between substantially clear and darkened states; and
        a plurality of beads disposed in a central portion of the cavity, the plurality of beads being configured to maintain a cell spacing between the first and second substrates, wherein the plurality of beads comprises a plurality of paramagnetic or ferromagnetic beads and are movable to a perimeter portion of the cavity; and
    a substantially transparent light emitting display disposed adjacent to the electro-optic device, wherein the electro-optic device is in the darkened state when the light emitting display is emitting light, wherein the plurality of beads is moved to the perimeter portion of the cavity by the following steps:
        (a) positioning the electro-optic device to generate an outwardly oriented hydrostatic force within the electro-optic device; and
        (b) allowing the plurality of beads to gravitationally descend to a position proximate the primary seal.

3. The emissive display system of claim 2, wherein the plurality of beads comprises a plurality of glass beads.

4. An emissive display system, comprising:
    an electro-optic device comprising:
        a first substantially transparent substrate having first and second surfaces, wherein at least one of the first and second surfaces comprises a first electrically conductive layer;
        a second substantially transparent substrate spaced apart from the first substrate, the second substrate having third and fourth surfaces, wherein at least one of the third and fourth surfaces comprises a second electrically conductive layer;
        a primary seal disposed around perimeter portions of the first and second substrates, wherein the seal and the first and second substrates define a substantially hermetic cavity therebetween;
        an electro-optic medium disposed in the cavity, the electro-optic medium being variably transmissive such that the electro-optic device is operable between substantially clear and darkened states; and
        a plurality of substantially opaque beads disposed in a central portion of the cavity, the beads configured to separate the first and second substrates by a predetermined distance, wherein the beads are substantially concealed when the electro-optic medium is in both the substantially clear and darkened states; and a substantially transparent light emitting display disposed adjacent to the electro-optic device, wherein the electro-optic device is converted to the darkened state when the light emitting display is emitting light.

5. The emissive display system of claim 4, wherein the plurality of beads are arranged in a grid pattern in the electro-optic medium.

6. The emissive display system of claim 5, wherein the plurality of beads are retained in the grid pattern via a constituent of the electro-optic medium.

7. The emissive display system of claim 4, wherein the plurality of beads comprises a basalt glass component.

8. The emissive display system of claim 4, wherein the light emitting display is an organic light emitting diode display.

9. The emissive display system of claim 4, wherein the plurality of beads is three-dimensionally printed onto one of the second and third surfaces.

10. The emissive display system of claim 4, wherein the substantially opaque beads have a largest dimension ranging from about 100 microns to about 1000 microns.

11. The emissive display system of claim 4, wherein the plurality of beads comprises a plurality of polymeric beads.

* * * * *